United States Patent [19]
Cedrone et al.

[11] Patent Number: 4,781,494
[45] Date of Patent: Nov. 1, 1988

[54] AIR-ASSIST ACCUMULATING AND TRANSFER UNIT FOR AN ELECTRONIC DEVICE TEST HANDLER

[75] Inventors: Nicholas J. Cedrone, Wellesley Hills; Robert J. Grenzeback, Winchester, both of Mass.

[73] Assignee: Daymarc Corporation, Waltham, Mass.

[21] Appl. No.: 864,290

[22] Filed: May 16, 1986

[51] Int. Cl.$^4$ .............................................. B65G 53/08
[52] U.S. Cl. ....................................... 406/52; 406/63; 406/85; 406/88; 361/331; 209/573; 312/97.1
[58] Field of Search ................. 406/52, 73, 74, 62, 406/63, 85, 88; 312/97.1, 135, 305; 209/573; 221/278; 414/403, 404, 331; 361/331, 382

[56] References Cited

U.S. PATENT DOCUMENTS

| | | | |
|---|---|---|---|
| 1,310,504 | 7/1919 | Rydquist | 312/97.1 |
| 2,044,998 | 6/1936 | Smith | 312/97.1 |
| 2,592,038 | 4/1952 | Kimsey | 312/135 |
| 2,646,891 | 7/1953 | Morgan | 312/135 |
| 2,889,187 | 6/1959 | Caruso | 312/97.1 |
| 3,158,417 | 11/1964 | Johnson | 312/97.1 |
| 3,710,958 | 1/1973 | Crowley et al. | 312/97.1 |
| 4,478,352 | 10/1984 | Amundson | 209/573 |
| 4,546,404 | 10/1985 | Cedrone et al. | 312/97.1 |

Primary Examiner—Galen Barefoot
Assistant Examiner—Lynn M. Fiorito
Attorney, Agent, or Firm—Wolf, Greenfield & Sacks

[57] ABSTRACT

An accumulating and transfer unit for handling electronic devices such as integrated circuits (ICs), especially surface mounted devices (SMDs). The unit includes guideways mounted circumferentially around a central shaft between two end plates and is inclined from the horizontal to utilize gravity, in cooperation with the levitation provided by a continuous or pulsed stream of air, to move the parts longitudinally in a column from the raised end of the unit to the lower end. In one embodiment, the guideways consist of a generally U-shaped track mounted on a track support and secured with a locking plate. A pair of longitudinally extending spaced apart walls on the bottom of each track act in cooperation with the track support and the locking plate to form a channel that directs the pulsed air from a supply tube at one end of the channel to a series of spaced apart apertures formed in the bottom wall of the track disposed so that the air acts through the apertures on the ICs held in the track. The guideways rotate around the central shaft from a single input port to a single exit port. The ICs load and unload from the track in a generally straight line column. The air can be heated or cooled.

5 Claims, 5 Drawing Sheets

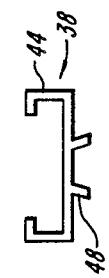
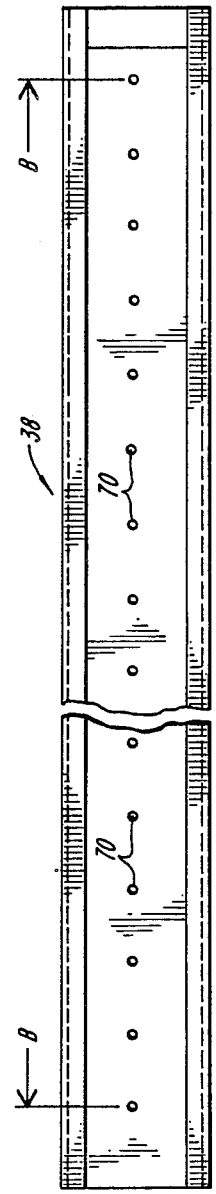
FIG. 4A
FIG. 4B
FIG. 5B
FIG. 5A

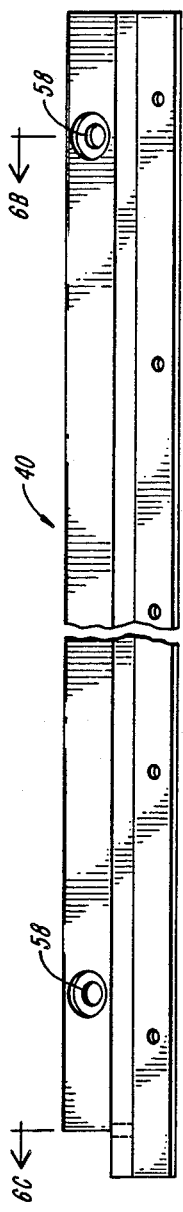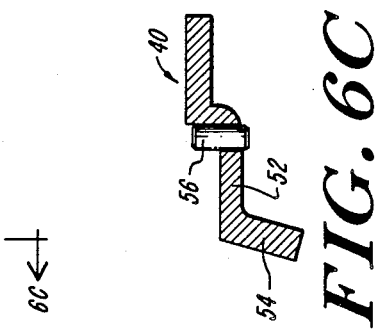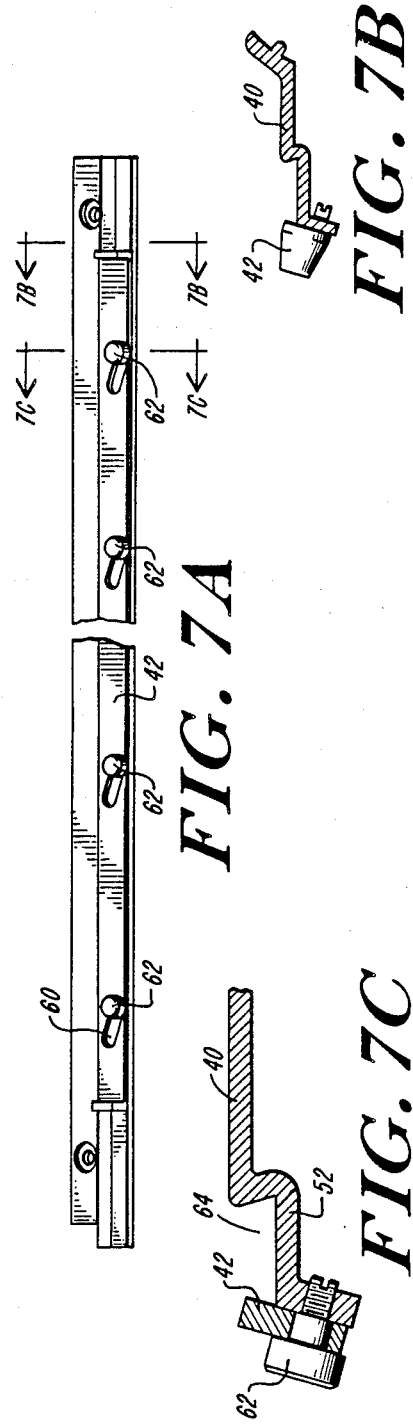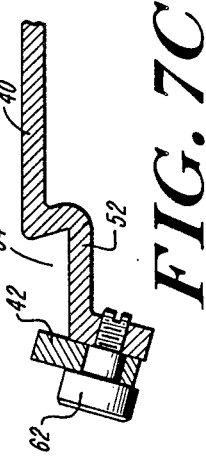

AIR-ASSIST ACCUMULATING AND TRANSFER UNIT FOR AN ELECTRONIC DEVICE TEST HANDLER

BACKGROUND OF THE INVENTION

This invention relates in general to accumulating and transport systems and more specifically to a unit that receives and discharges integrated circuits while bringing them to a preselected temperature during their residence in the system.

In the manufacturing and use of ICs it is necessary to test them reliably and rapidly. Many ICs must be heated or cooled uniformly to a preselected temperature prior to testing to simulate actual operating conditions. Modern high-speed testing equipment must therefore include a time delay transport device that can heat or cool the IC to the preselected temperature. The transport unit must also be able to receive the ICs from "tubes" or "sticks" where they are stored in an end-to-end linear array and discharge them quickly and reliably at an input to the testing area. It is also highly desirable for the accumulation and transport system to accept any of a variety of IC packages or sizes, to have a high storage density, and to have a single input port and a single exit port to interface readily with automated feed and handling systems.

Integrated circuits usually have one of two predominant package configuration: DIP (dual-in-line packaged) and SMD (surface-mounted device). DIP ICs are generally rectangular, box-like devices of plastic or ceramic with a row of pins extending downwardly along two sides. SMD ICs, in contrast, usually have an approximately square configuration and typically have a rows of pins extending from at least two sides. In either case, during handling it is important not to permanently displace any of the pins, which can occur readily since forces as small as a few grams can introduce a permanent distortion in the position of the pin. In addition, the packages themselves can be comparatively fragile and susceptible to damage, particularly where the package material is a ceramic.

One approach to storage and transport used with DIP ICs has been to transfer the ICs from a tube into one or more holding rails that are mounted generally parallel to one another and in a circle. This assembly rotates about the common axis of rotation located at the center of the circle and inclined with respect to the ground. The ICs are loaded onto the rails at one angular position and discharged at another. The time delay and heating occurs as the rails rotate between these positions. The pins straddle the rail to hold the IC on the rail, in cooperation with other elements, as the assembly rotates. Since many SMD packaged ICs have pins on all four sides, and none project from the body of the device in a manner conductive to this "straddling", this approach has not been adapted to SMD ICs.

Another approach to the handling problem has been to feed the ICs onto a horizontal carousel. The ICs are arrayed about the periphery of the carousel. The carousel rotates each IC from a loading point to a discharge point. During this rotation, the ICs are in a heated environment that brings them up to the desired testing temperature. This approach has a low storage density.

Still another approach to handling DIP ICs is shown in U.S. Pat. No. 4,546,404 to Cedrone et al entitled "Storage Unit For An Integrated Circuit Tester". In this approach, a time-delay storage unit automatically and continuously receives, accumulates, and discharges ICs. The apparatus is organized around a frame assembly that rotates about an axis of rotation that is inclined with respect to the horizontal. The ICs slide into and out of generally parallel, elongated guideways arrayed concentrically about the axis of rotation. A drive system indexes the frame and guideways carried in the frame through a series of angular positions including a load position and an unload position. A key feature of this approach is that the DIP ICs are carried in guides that are mounted in a "ferris wheel" manner so that the ICs maintain generally the same orientation throughout the rotation.

Another handler has utilized air levitation in the storage area. The Siemens' Model 1108-HSS DIP IC handler contains an input tray having multiple fixed tracks for the incoming ICs, and a single output for the devices. Air is used to float the devices as they are moved by gravity down the fixed tracks. Two moving belts in a V configuration span the lower ends of the tracks and converge at the discharge point. This handler has a variety of limitations. It is sensitive to the geometry of the devices. It can handle reliably only devices of a configuration such as DIP ICs and certain types of SMD ICs. However, even with these rectangular devices there is a sensitive relationship between the device and the machine. Further, since the input tracks are fixed, the tray is primarily for use with ICs of only one size. Yet another significant limitation of this handler is that these multiple tracks require a like multiple number of input ports. These inputs must be fed either manually, which requires generally continuous operator attention, or the use of a complex and costly automated linear feed shuttle.

While the design considerations are different, air levitation has been used in other areas of test handlers besides storage and heat exchangers, for example in the binning channels of the Daymarc Model 1157 test handler. But in each instance the tracks have been fixed in space and they have been fed with pressurized air for the levitation from a common plenum.

It is therefore an object of the present invention to provide an accumulating and transport system which accepts a variety of types and sizes of integrated circuits, particularly surface-mounted ICs.

Another object of the invention is to provide such a system which is also compact, has a high storage density, and has a single port input and a single port output.

Another object of the invention to provide an accumulating and transport system for SMDs that operates reliably, with a low incidence of jams, and which is not sensitive to package configuration or size.

Yet another object is to provide such a system which can be converted to accept ICs of a different size or package configuration easily, quickly and using a low level of skill.

SUMMARY OF THE INVENTION

An accumulating and transfer unit for use in an IC handler and tester consisting of a number of inclined, elongated guideways that guide ICs arrayed in a column and stored in tubes from a single entry port to a single exit port. A central shaft and frame mount the guideways and the entire assembly rotates in a step-wise manner around the shaft at a rate such that the ICs are able to equilibrate to a preselected testing temperature during the transmit time between their loading at the input to their unloading at the output.

In the preferred embodiment, the guideways consist of three main parts: a generally U-shaped track, a track support, and a locking plate mounted on the track support that secures the track to the support. The tracks have a pair of mutually spaced apart, longitudinally extending walls that each project downwardly from the floor of the track. The locking plate slides over posts mounted on the track support between a release position, which allows the removal of the track, and a lock position, which secures it onto the support. When the locking plate is in the lock position it acts in cooperation with the track support and the pair of walls to form a hollow passage extending below the track for its full length. A source of pressurized air, for many applications preferably pulsed, is directed into one end of the hollow passage. The other end of the passage is blocked. The air exits the passage through a series of apertures in the track floor which carries a column of the ICs. Pulsing the air distributes the air flow through the apertures in a pressure wave along the length of the track to ensure that all of the ICs held in the track receive at least periodic bursts of air levitation to ensure that gravitational forces moving, or tending to move, the ICs down the track overcome the frictional forces between the ICs and the track. The tracks are constructed of a smooth, strong material so that the ICs move freely along their length. Also, the tracks preferably have a generally U-shaped configuration with inwardly projecting walls at the upper open ends of the side walls to secure the ICs in the tracks during the rotation.

The guideways are rotated circumferentially around the central shaft by hubs that mount the guideways and gears located at the end plates. The source of pressurized air is also located at the end plates, preferably at the upper end. The pressurized air, as well as the surrounding chamber, may be heated or cooled in order to bring the ICs to a preselected testing temperature, as to assist in reaching or maintaining a preselected temperature set by some of the heating or cooling system operating to heat or cool the air in the system.

BRIEF DESCRIPTION OF THE DRAWINGS

FIG. 4a is a view in side elevation with a portion broken away of the track of the transfer unit of FIG. 2;

FIG. 4b is a cross-sectional view of the track shown in FIG. 4a along line B—B;

FIG. 5a is a top plan view of the upper portion of the track shown in FIG. 4;

FIG. 5b is a cross-sectional view of the track support shown in FIG. 5a taken along line B—B;

FIG. 6a is a top plan view of one of the track support shown in FIG. 2 and FIG. 5;

FIG. 6b is a cross-sectional view of the track support shown in FIG. 6a taken along line B—B;

FIG. 6c is a cross-section of the track support showng in FIG. 6a taken along line C—C;

FIG. 7a is a view in side elevation of the locking plate mounted on the track support shown in FIG. 6a;

FIG. 7b is a cross-section of the track support and locking plate shown in FIG. 7a taken along line B—B;

FIG. 7c is a cross-sectional view of the locking plate, track support and mounting screw shown in FIG. 7a taken along line C—C.

DETAILED DESCRIPTION OF THE INVENTION

Figure 1:
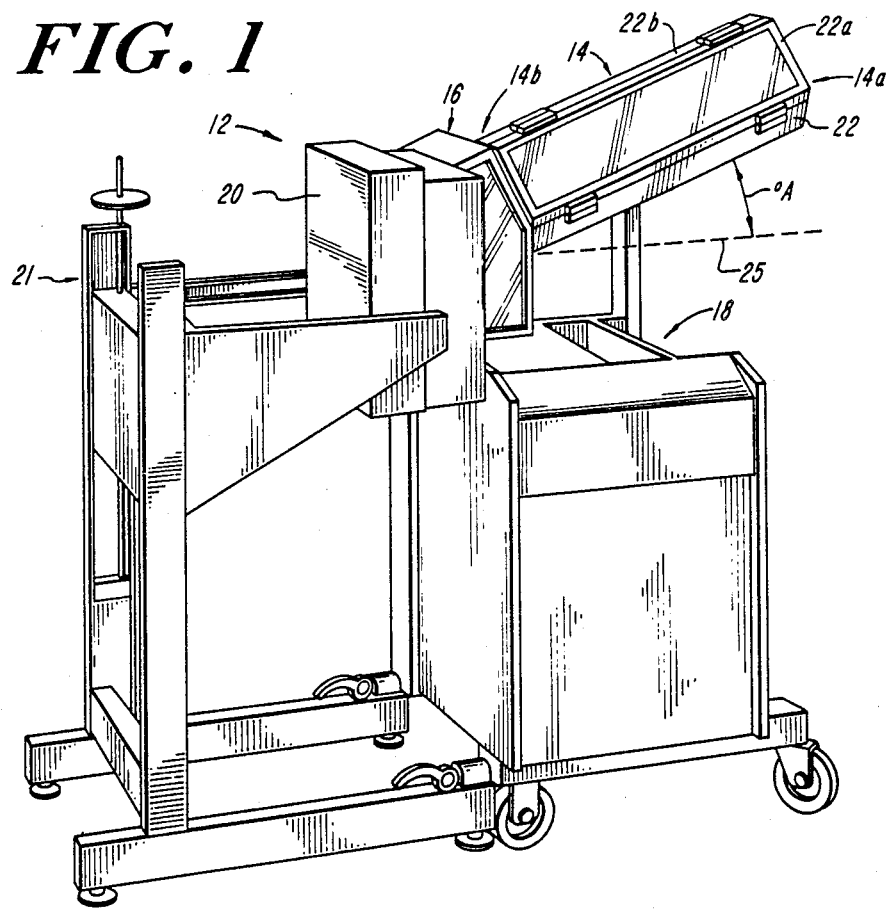
FIG. 1 is a simplified view in perspective of a machine for testing ICs that utilizes a transfer and accumulating unit according to the present invention.
Figure 2:
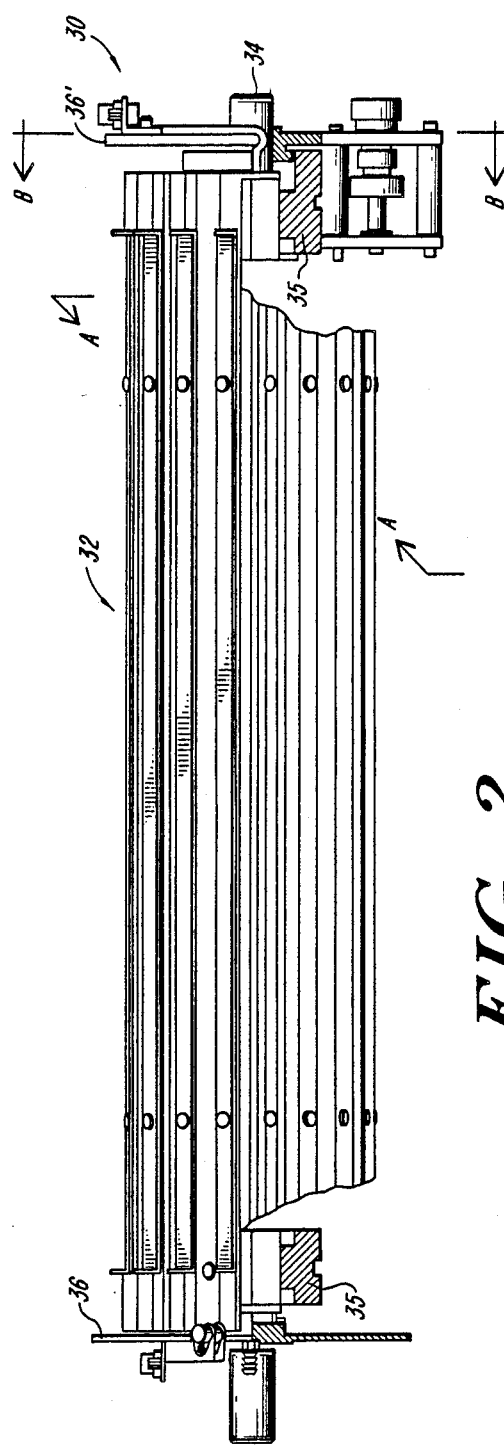
FIG. 2 is a view in side elevation of the transfer and accumulating unit of the present invention.

FIG. 1 shows an integrated circuit (IC) test handler 12 that includes a storage unit 14, a test assembly 16, a sorter 18, and test circuitry 20 mounted on a frame 21 and positioned immediately adjacent a test site for the ICs in the test assembly 16. The test handler 12 is particularly adapted to testing SMD packaged ICs. The storage unit includes an outer insulated enclosure or housing 22, which is generally box-like and includes a hinged door 22a that allows ready access to the interior of the housing where a frame assembly 30 and associated guideways 32 carried on the frame, shown in FIG. 2, are mounted. It also includes conventional heating elements and controls (not shown) that can raise the temperature of the ICs held in the storage unit to a preselected pretesting temperature T during the time interval between when an IC is first loaded into the storage unit and when it is discharged to the assembly 16 for testing.

The entire housing 22, as well as the frame assembly 30, are inclined at an acute angle A with respect to the horizontal (indicated by dashed line 25). With this inclined orientation, ICs loaded into the storage unit at its elevated end 14a are fed under the influence of gravity to its lower end 14b where they are discharged to the test assembly 16.

Figure 3:
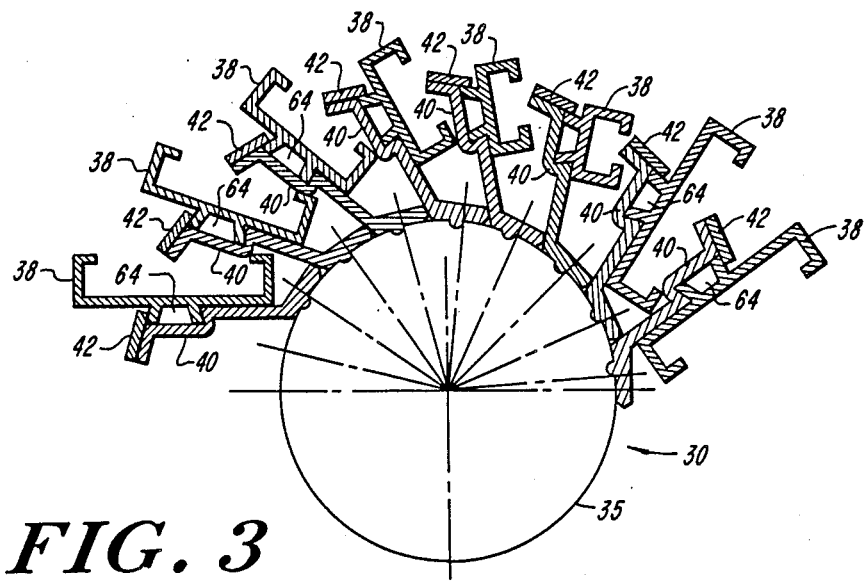
FIG. 3 is a cross-sectional view of the transfer unit of FIG. 2 taken along line A—A and illustrating tracks of varying sizes.

As shown in FIGS. 2 and 3, the frame assembly 30 is organized about a central shaft 34 mounted in a pair of end plates 36,36' on opposite ends of the shaft 34 and generally perpendicular to the shaft 34. The shaft 34 supports a pair of generally cylindrical hubs 35,35 that lie between the end plates 36,36 and rotate about the shaft 34. The guideways 32 extend along the frame assembly 30 between the end plates 36 and generally parallel to the axis of rotation. The guideways are secured on the hubs 35. As more clearly shown in FIGS. 4–7, the guideways consist of three main parts: a track 38; a track support 40; and a locking plate 42. As shown in FIG. 3, the width and height of the tracks 38 may be varied according to the size of the IC device to be stored and tested. The common IC sizes vary from 18 to 100 pins.

As shown in FIGS. 4a and 4b, the track 38 has an upper U-shaped portion 44 and a lower portion 46 consisting of two mutually spaced apart, longitudinally extending walls 48 each projecting downwardly and slanted outwardly from the center of the floor 44a of track portion 44. The upper portion 44 also includes two side walls 44b,44b, each with an inwardly projecting flange 44c that overlies the ICs stored in the track.

As shown in FIGS. 6a, 6b, and 6c, the track support 40 is an irregularly shaped member having one side 50 which is bolted to the hub 34, a track support portion 52 on which the legs 48 of track 38 rest, and a portion 54 to which the locking plate 42 is secured. At the lower end of the support 40, a locating pin 56 locates and holds the track in position longitudinally. Bolts 58 secure the support 40 to the frame assembly 30. Other means for securing the support 40 known to those skilled in the art may be substituted for bolts 58.

The locking plate 42 is slidably mounted on the portion 54 of the track support 40. Elongated, closed slots 60 formed in the body of the locking plate 42 ride on the shoulders of screws 62. Movement of the locking plate along these slots carries it between a lowered "release" position in which the track 38 is readily lifted from the track support and an upper "lock" position where the plate 42 is adjacent the outermost track wall 48 to thereby secure it on the track. In the lock position the plate 42 cooperates with the support portion 54 to provide a labyrinth seal to restrict the flow of air from a hollow, elongated passage 64 formed by the floor 44a, the lower walls 48,48, the support portion 52, and the locking plate 42. As may be seen from comparing FIGS. 7c and 4b, the configuration of the walls 48 and the shape of the opening created by the raised locking plate 42 and portion 52 of the track support 40 are complementary, both to facilitate the formation of the passage 64 and to secure the track 38 on the support 40 when the plate 42 is in the lock position.

The track 38 is designed to be of a width just exceeding the width of the IC to be stored. The preferred material for constructing both the track 38 and support 40 is polished aluminum, stainless steel, plastic or some other relatively strong, light weight material with a low coefficient of sliding friction. In the preferred embodiment, the frame assembly 30 is located at an angle of approximately 20° above the horizontal, indicated by dashed line 25 in FIG. 1. At much greater angles of inclination, the likelihood of damage to the IC pins increases to an unacceptable level. At much lower angles of inclination, the friction between the ICs and the track is sufficient to interfere with, or stop altogether, a gravity-feed of the ICs along the track. At 20° of inclination, with PLCC type SMD ICs, the gravitational forces and the frictional forces are close to a balance.

Figure 8:
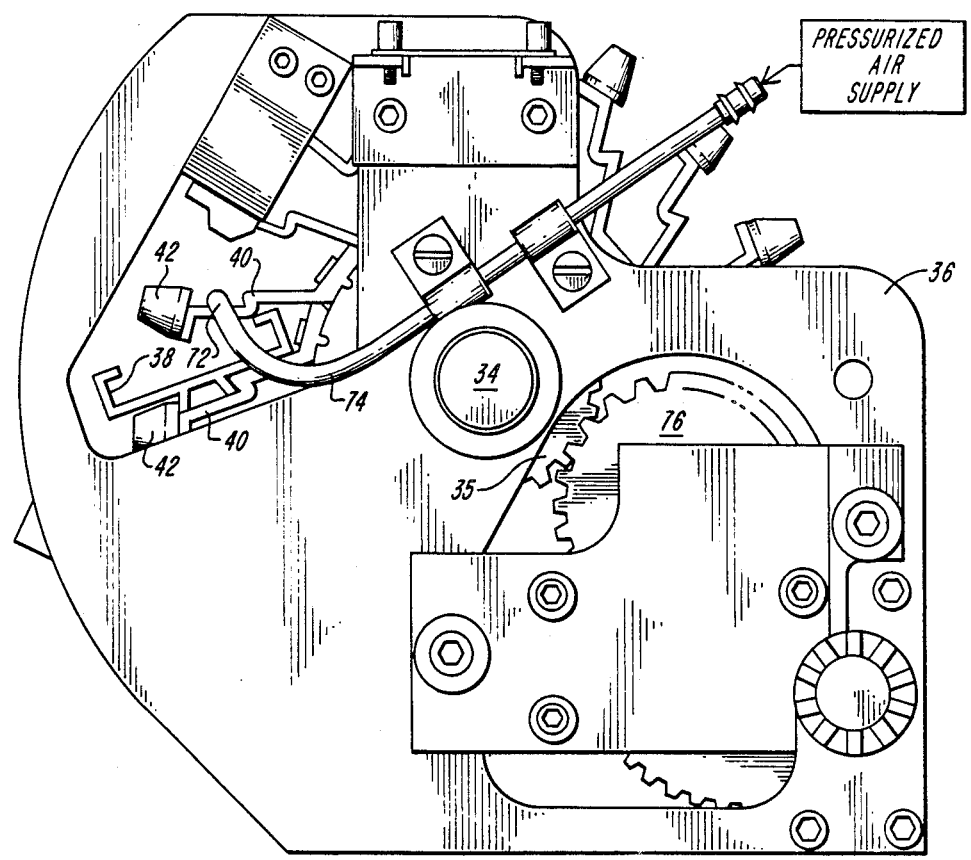
FIG. 8 is an end view of the mounting and rotating assembly for the track and track supports shown in FIG. 2 taken along line B—B.

In order to facilitate the flow of the ICs down tracks 38, a high pressure air stream, preferably one that is pulsed, is channelled upwardly through the bottom of track 38. As shown in FIGS. 5a and 5b, small holes 70 are sequentially located along the centerline of track 38. As shown in FIGS. 8, air is provided to the space between track 38 and support 40 by means of a nozzle 72 attached to hose 74, which leads to a conventional source of pressurized air indicated schematically at 75 in FIG. 8. In the preferred embodiment, the air is heated or cooled to the desired testing temperature. Further, in the preferred embodiment, the air enters the space between track 38 and support 40 at the upper end of the frame assembly 30.

While a continuous supply of air may be used, in practice, since the lower end of the passage 64 is closed, air pressure within the passage 64 in static and varies along its length. By pulsing the air, a pressure wave sweeps the passage 64 to provide levitation along the entire track. As noted above, the walls 48 form a labyrinth seal with track support 40. The pressure is, of course, adjusted in value depending on the devices being handled and other variables.

In the preferred embodiment, eighteen guideways 32 are mounted on the hub 35 with locating ridges mating with appropriately spaced mating grooves in the hubs. This provides for a higher density storage and transfer of ICs than is possible with other IC test handler designs.

The guideways 32 are rotated in a step-wise manner around the central shaft 34 with one hub 35 and gear 76, shown in FIG. 8. The rate at which the gear 76 rotates the guideways 32 is dependent on the time required for the ICs to reach the desired temperature and the rate at which the ICs are discharged to the test unit 16.

This invention has a number of advantages in addition to high density storage of ICs, including low maintenance, versatility and minimizing damage to the ICs. For example, the locking plate 42 allows for rapid, easy removal of track 38 either for purposes of changing sizes of ICs to be tested or in routine maintenance. Also this storage system is compact and adapted for use in the Model 757 IC test handler sold by Daymarc Corporation.

Variations and modifications of the transfer and accumulating unit for an IC test handler will occur to those skilled in the art from the foregoing detailed description and accompanying drawings. For example, while the description has focused on the storage and movement of ICs, particularly SMD ICs, it can also be used for other electronic devices such as transistors with appropriate modifications in the cross-sectional configuration of the tracks 38. Such modifications and variations are intended to fall within the scope of the appended claims.

I claim:

1. Transport and storage means for a tester of electronic devices comprising:
   a frame that rotates about a central axis and is inclined from the horizontal;
   a plurality of elongated support members secured on said frame and extending generally parallel to the axis of rotation of the frame;
   a plurality of elongated tracks located on said support members, said tracks each holding a plurality of electronic devices in a line;
   locking means for replaceably securing said tracks onto said support members;
   means for rotating said frame in a step-wise manner about said axis of rotation through a preselected number of angular positions that include a load position where the devices are loaded in line into one of said tracks and a feed position where the devices are discharged from said tracks; and
   means for providing air levitating to the devices held in the track at said feed position to facilitate movement of the devices along the tracks in cooperation with the force of gravity, said air levitating means including spaced apart apertures formed in the floors of said tracks and a plurality of longitudinally extending passages located below said floors, wherein each said passage is in fluid communication with said apertures and a source of pressurized air.

2. The storage means of claim 1 wherein said pressurized air is pulsed.

3. The storage means of claim 1 wherein the tracks have an upper generally U-shaped portion and a lower portion having two walls extending outwardly and downwardly from the center of said upper portion.

4. The storage means of claim 3 wherein the track support members and locking means engage a lower portion of the tracks in a close fitting relationship.

5. The storage means of claim 4 wherein said locking means is slidably mounted on said support members and movable between a release and a locking relationship with said tracks.

\* \* \* \* \*